(12) United States Patent
Yan et al.

(10) Patent No.: US 11,949,803 B2
(45) Date of Patent: *Apr. 2, 2024

(54) LOCKING MECHANISM OF A MOBILE TERMINAL BATTERY COVER

(71) Applicant: Hand Held Products, Inc., Charlotte, NC (US)

(72) Inventors: Xianwei Yan, Suzhou (CN); Zach Zhang, Suzhou (CN); Xiaofang Yang, Suzhou (CN); David Chaney, Lincolnton, NC (US)

(73) Assignee: Hand Held Products, Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/157,670

(22) Filed: Jan. 20, 2023

(65) Prior Publication Data
US 2023/0208952 A1    Jun. 29, 2023

Related U.S. Application Data

(63) Continuation of application No. 16/650,662, filed as application No. PCT/CN2017/105254 on Oct. 4, 2017, now Pat. No. 11,570,287.

(51) Int. Cl.
*H05K 5/02* (2006.01)
*H04M 1/02* (2006.01)
*H05K 5/03* (2006.01)

(52) U.S. Cl.
CPC ........ *H04M 1/0262* (2013.01); *H05K 5/0221* (2013.01); *H05K 5/0256* (2013.01); *H05K 5/03* (2013.01)

(58) Field of Classification Search
CPC ...................................................... H05K 7/00
See application file for complete search history.

(56) References Cited

U.S. PATENT DOCUMENTS

| 8,257,851 | B2 | 9/2012 | Tang |
| 9,844,158 | B2 | 12/2017 | Shi et al. |

(Continued)

FOREIGN PATENT DOCUMENTS

| CN | 101771139 A | 7/2010 |
| CN | 106899713 A | 6/2017 |

OTHER PUBLICATIONS

Advisory Action received for U.S. Appl. No. 16/650,662, dated Mar. 16, 2022, 3 pages.

(Continued)

*Primary Examiner* — Jerry Wu
(74) *Attorney, Agent, or Firm* — Alston & Bird LLP

(57) ABSTRACT

The present invention provides a locking mechanism in a mobile terminal and a method of manufacturing the same. The locking mechanism comprises a slider, latch, button, and spring. The slider and latch include openings and may translate between a locked position and an unlocked position. The latch may include a protrusion that limits the translation of the slider and the latch when in the locked position. The button is located within the opening of the slider and the opening of the latch, and the spring member is fixed adjacent the latch. In an instance in which an external force is applied to the button, the external force deforms the spring member such that contact between a vertical edge of the protrusion and the spring is precluded allowing translation of the slider and the latch between the locked position and the unlocked position.

20 Claims, 12 Drawing Sheets

(56) References Cited

U.S. PATENT DOCUMENTS

| | | | |
|---|---|---|---|
| 11,570,287 B2 | 1/2023 | Yan et al. | |
| 2005/0222539 A1 | 10/2005 | Gonzales et al. | |
| 2009/0179435 A1* | 7/2009 | Lev | E05B 65/006 |
| | | | 292/164 |
| 2010/0167114 A1 | 7/2010 | Tang | |
| 2017/0181299 A1* | 6/2017 | Shi | H04M 1/0262 |

OTHER PUBLICATIONS

Examiner Interview Summary Record (PTOL - 413) dated Apr. 22, 2021 for U.S. Appl. No. 16/650,662.
Examiner Interview Summary Record (PTOL - 413) dated Jul. 23, 2021 for U.S. Appl. No. 16/650,662, 2 page(s).
Examiner Interview Summary Record (PTOL - 413) dated Mar. 16, 2022 for U.S. Appl. No. 16/650,662, 1 page(s).
Examiner Interview Summary Record (PTOL - 413) dated May 2, 2022 for U.S. Appl. No. 16/650,662, 1 page(s).
Final Office Action received for U.S. Appl. No. 16/650,662, dated Jan. 7, 2022, 8 pages.
International Search Report of the International Searching Authority for PCT/CN2017/105254 dated Jul. 11, 2018.
Non-Final Office Action received for U.S. Appl. No. 16/650,662, dated Jul. 22, 2021, 6 pages.
Notice of Allowance and Fees Due (PTOL-85) dated Sep. 19, 2022 for U.S. Appl. No. 16/650,662.
Notice of Allowance received for U.S. Appl. No. 16/650,662, dated May 2, 2022, 9 pages.
Outgoing Written Opinion of the ISA dated Jul. 11, 2018 for WO Application No. PCT/CN17/105254, 3 pages.

* cited by examiner

LOCKING MECHANISM OF A MOBILE
TERMINAL BATTERY COVER

CROSS-REFERENCE TO RELATED
APPLICATIONS

This patent application is a continuation of U.S. patent application Ser. No. 16/650,662, filed Mar. 25, 2020, which claims priority from PCT Application No. PCT/CN2017/105254, filed Oct. 4, 2017, each of which is incorporated by reference in its entirety.

TECHNICAL FIELD

The present invention relates to a locking mechanism of a back cover of a portable device, and more particularly to a battery cover locking mechanism of a mobile terminal.

BACKGROUND OF THE INVENTION

Mobile terminal devices (e.g., mobile phone, tablet, Personal Digital Assistant (PDA), and remote controller) are more and more into people's work and life to provide much more conveniences for people's work and life. At present, most of the mobile terminals need a battery to power them.

Generally, Industry Mobile Terminal's battery is hard to remove, especially to those need water proof by sealing O-ring, if the battery is too easy to remove, it will easy fail in a drop test.

However, in industrial application, usually the battery may need to be replaced frequently in the field, so we need to design a battery cover locking mechanism which is easy to unlock but could survive the drop test.

SUMMARY OF THE INVENTION

In the embodiments of the present invention, there is provided a locking mechanism in a mobile terminal, comprising a lock button, a slide latch, and an spring member; the slide latch may slide between a first position and a second position, and the slide latch comprises a hole and snaps, the hole is on the top of the slide latch and extends through the slide latch, and the snaps are at the front side of the slide latch; the lock button is in the hole and comprises a press part and a support part, the support part being connected to the press part and extending downward from the press part through the hole to be in contact with the contact part on the spring member; the spring member is fixed with the slide latch and comprises an spring reaction part, a contact part and a protrusion part, the contact part being in contact with the support part of the lock button and a force from the support part causing a spring deformation in the spring reaction part; when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part (354) moving to an unblocked position; in a case where the protrusion part is not blocked, the slide latch may slide between the first position and the second position for snapping or unsnapping by the snap.

In a further embodiment of the present invention, there is provided a mobile terminal comprising a back housing, the back housing comprising a back housing body and a battery cover, the locking mechanism according to any one of examples 1-8 is located in one of the back housing body and the battery cover; and a second snap is formed on the other one of the back housing and the battery cover, for snapping with the snap on the slide latch in the locking mechanism to fix the back housing body and the battery cover together.

In still a further embodiment of the present invention, there is provided a method of manufacturing a locking mechanism in a mobile terminal, the locking mechanism comprising a lock button, a slide latch, and spring member, the method comprising: providing the slide latch, the slide latch may slide between a first position and a second position and comprise a hole and snaps, the hole is on the top of the slide latch and extends through the slide latch, and the snaps are at the front side of the slide latch; providing the lock button in the hole, the lock button comprising a press part and a support part, the support part being connected to the press part and extending downward from the press part through the hole to be in contact with the contact part on the spring member; providing the spring member and enabling the spring member to be fixed with the slide latch, the spring member comprising an spring reaction part, a contact part and a protrusion part, the contact part being in contact with the support part of the lock button and a force from the support part causing a spring deformation in the spring reaction part; when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part moving to an unblocked position; in a case where the protrusion part is not blocked, the slide latch may slide between the first position and the second position for snapping or unsnapping by the snap.

BRIEF DESCRIPTION OF THE DRAWINGS

Various embodiments in different aspects of the disclosure are illustrated in the drawings for interpreting the principle of the present invention together with the description. It may be appreciated by those skilled in the art that the specific embodiments shown by the drawings are merely illustrative, which are not intended to limit the scope of the present invention. It should be realized that one element in some embodiments may be separated into a plurality of elements, or a plurality of elements may be combined into one element. To describe the illustrative embodiments of the present invention in a greater detail so that those skilled in the art can understand different aspects of the disclosure as well as features and advantageous more thoroughly, now referring to the drawings, wherein.

DETAILED DESCRIPTION OF THE EMBODIMENTS

Some terms are used to indicate particular system components throughout the application document. The terms "comprising", "including" and "having" are used in an open form in the present application document, thus they may be interpreted as "including but not limited to . . . ". In addition, terms "essentially", "substantially" or "approximately" that may be used in the document relate to the tolerance of corresponding terms accepted in the industry.

Many specific details are provided in the following descriptions for the purpose of interpretation to provide a thorough understanding of the present invention. However, it may be apparent to those skilled in the art that the apparatus, method and device of the present invention may be implemented without these specific details. Reference to "embodiment", "example" or similar words in the present description means the specific features, structures or characteristics described in the embodiment or example are included in at least one of the embodiments or examples, but may not be included in other embodiments or examples.

Figure 1:
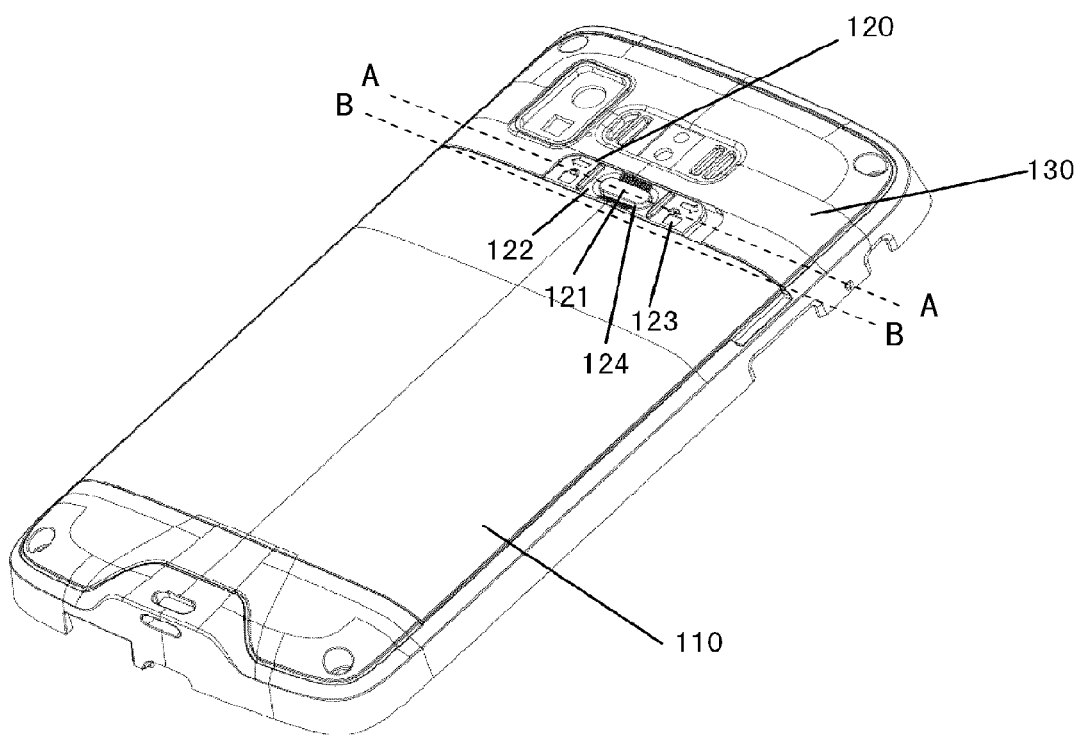
FIG. 1 is a conceptual diagram illustrating the Industry Mobile Terminal's back housing according to the embodiment of the present invention.

FIG. 1 is a conceptual diagram illustrating the Industry Mobile Terminal's back housing according to the embodiment of the present invention. As shown by FIG. 1, the back housing 100 of the Industry Mobile Terminal comprises a back housing body 130 and a battery cover 110. A battery assembly (not shown) is provided below the battery cover 110, or the battery assembly may also be integral with the battery cover together so that the battery assembly may be taken out by detaching the battery cover 110. The back housing body 130 comprises a locking mechanism 120, certainly the back housing body 130 may also comprise various other components such as a camera, a flash lamp, a fingerprint recognition device and the like. Since these components are not closely related to the invention object, no more unnecessary details will be provided here. The battery cover 110 is bonded to the back housing body 130 via the locking mechanism 120.

As shown by FIG. 1, the locking mechanism 120 is provided in the back housing body 130. Optionally, the locking mechanism 120 may also be provided in the battery cover 110. The locking mechanism 120 comprises a lock button 121, a slide latch 122 and a spring member (not shown), which will be described in detail below. The slide latch 122 comprises a hole 124, and the lock button 121 is inserted into the hole 124.

The slide latch 122 may slide leftward to the first position and slide rightward to the second position. When the slide latch 122 is in the first position, the battery cover 110 is snapped with the back housing body 130, and when the slide latch 122 is in the second position, the battery cover 110 is unsnapped with the back housing body 130, so that the battery cover and the battery assembly may be detached by one hand only, as shown by the indicator 123 in FIG. 1. Of course, the snapping position and the unsnapping position may be interchanged, e.g., the first position is the unsnapping position and the second position is the snapping position. The lock button 121 is provided in the hole 124 of the slide latch 122 for locking or unlocking the slide latch 122. For example, if the slide latch 122 is locked by the lock button 121, the slide latch 122 cannot slide to the left or right, thereby avoiding loose of the battery cover 110 and the back housing body 130 due to unsnapping them erroneously or undeliberately. For example, the spring member (not shown) may be triggered by pressing the lock button 121 to unlock the slide latch 122 so that the slide latch 122 may slide to the left and right freely. Once the lock button 121 is released, the slide latch 122 will be relocked, which will be described in detail below.

Figure 2:
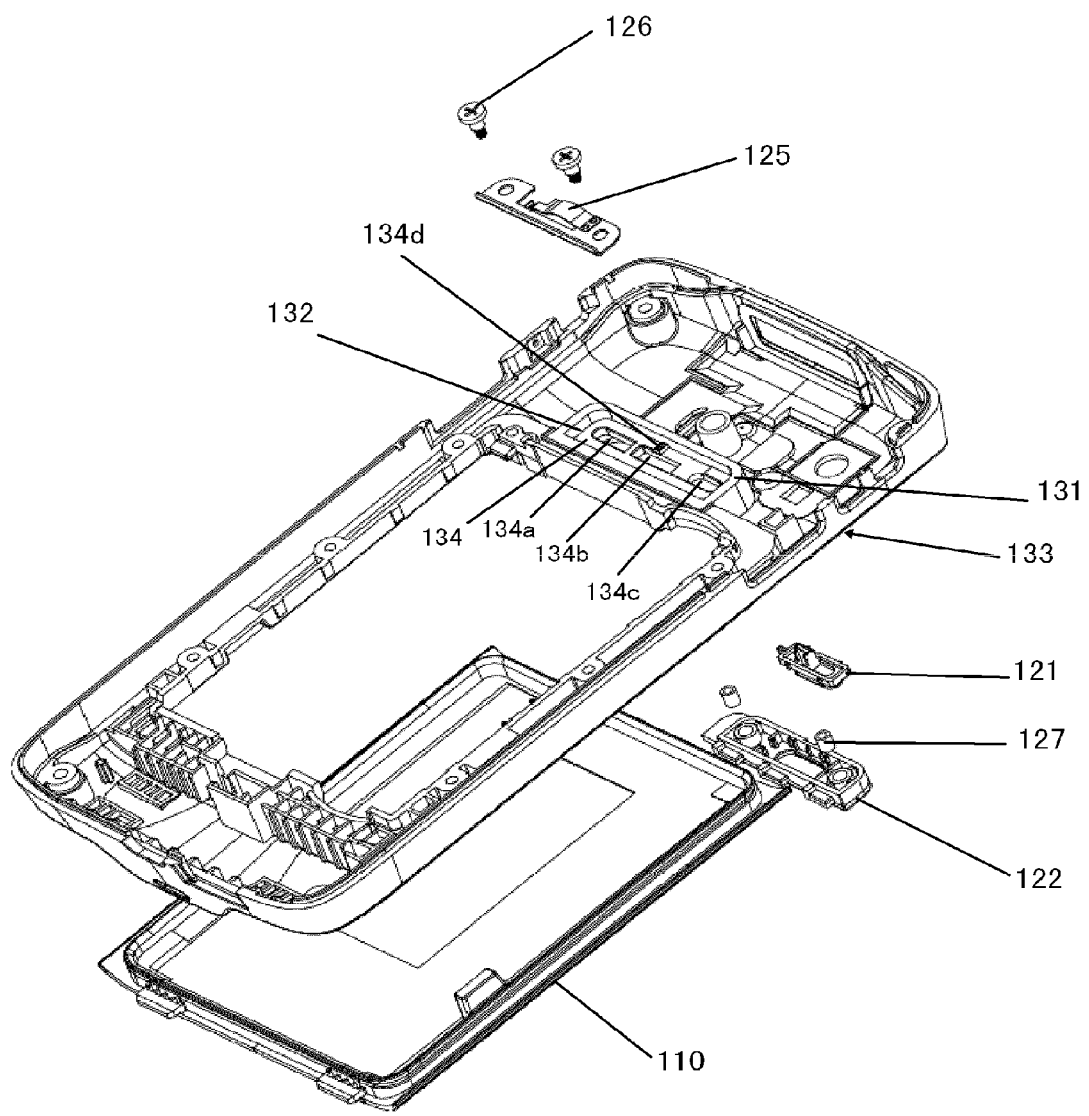
FIG. 2 is an unfolded diagram showing the structure of Industry Mobile Terminal's back housing in FIG. 1 according to the embodiment of the present invention.

FIG. 2 is an unfolded diagram showing the structure of Industry Mobile Terminal's back housing in FIG. 1 according to the embodiment of the present invention. The unfolded diagram of FIG. 2 is a schematic diagram illustrating the structure of FIG. 1 after being turned over. As shown by FIG. 2, the back housing body 130 comprises a mounting part 131 for receiving the locking mechanism 120. The mounting part 131 comprises a first mounting base 133 (not shown in FIG. 2) on a first side of the mounting part and a second mounting base 132 on a second side of the mounting part, wherein the first side and the second side are opposite to each other. The first mounting base 133 is separated from the second mounting base 132 by a partition board 134. As shown by FIG. 2, a protruded block 134d, which cooperates with the spring member 125, is formed on the partition board 134 in the second mounting base, the cooperation principle thereof will be discussed below. Three sliding slots, i.e., a first sliding slot 134a, a second sliding slot 134b and a third sliding slot 134c are further formed on the partition board 134. The three sliding slots extend in a lengthwise direction of the partition board 134 and communicate the first mounting base 133 and the second mounting base 132.

The locking mechanism 120 comprises a lock button 121, a slide latch 122, and a spring member 125. The lock button 121 is mounted on the slide latch 122 through the hole 124, and the lock button 121 and the slide latch 122 are both mounted in the first mounting base 133. The spring member 125 is in the second mounting base 132, and screws 126 and a nuts 127 pass through the first sliding slot 134a and the third sliding slot 134c to fix the spring member 125 with the slide latch 122, so that the slide latch 122 and the spring member 125 may slide along the sliding slot together. The spring member 125 may interact with the block 134d during the sliding, as described in detail by FIG. 3 below. Furthermore, a part (i.e., the support part, see FIG. 3) of the lock button 121 extends through the second sliding slot 134b to be in contact with the spring member 125.

FIGS. 3A-3D are section views of the locking mechanism 120 according to the embodiment of the present invention, the section views are obtained by sectioning along the line A-A as shown by FIG. 1. FIGS. 3A-3D show the unlocking process of the locking mechanism 120.

Figure 3A:
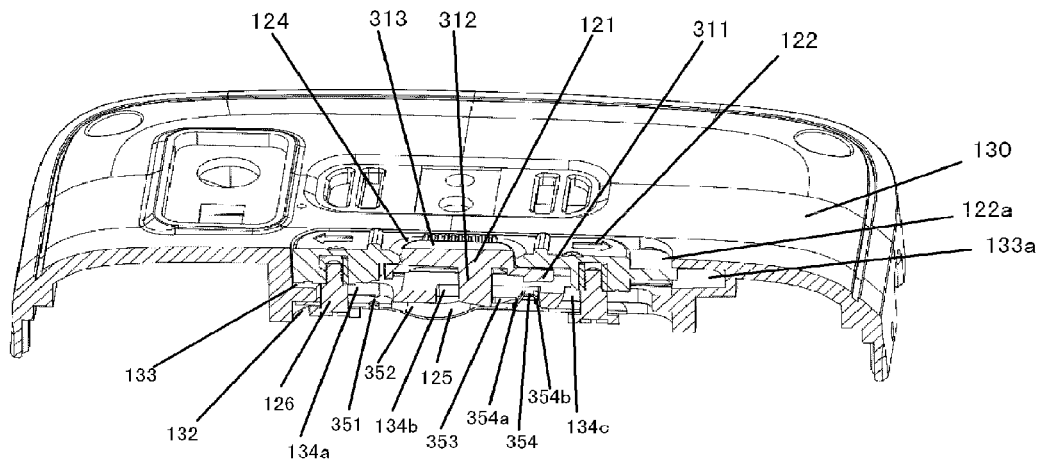
FIGS. 3A-3D are section views of the locking mechanism according to the embodiment of the present invention.

First, referring to FIG. 3A, it depicts the constituting structure of the locking mechanism 120 mounted in the mounting part 131 of the back housing body 130. The locking mechanism 120 comprises a lock button 121, a slide latch 122 and a spring member 125. The lock button 121 is mounted in the hole 124 of the slide latch 122, and both of them are located in the first mounting base 133. The lock button 121 comprises a press part 313, a support part 312 and a fixing part 311. The press part 313 is to be pressed by an operator to perform the action of the lock button. The support part 312 is connected to the press part 313 and extends downward from the press part through the second sliding slot 134b in the partition board 134 (see FIG. 2), the downward extension may be vertical downward, inclined downward or downward in any path (e.g., arc-shape or bending-shape). The support part 312 extends downward to be in contact with the contact part 353 of the spring member 125 located in the second mounting base 132. The fixing part 311 of the lock button is connected to the press part 313 and extends laterally from the bottom of the press part 313, the extending range goes beyond the range of the hole 124 in the slide latch so that the fixing part 311 is blocked by the periphery portion of the hole 124, preventing detachment of the lock button 121 from the hole 124. In another embodiment, the fixing part 311 may also extend laterally from the support part 312, with its extending range going beyond the range of the hole 124 in the slide latch. In still another embodiment, the fixing part 311 may adopt any other suitable structure, so long as it prevents detachment of the lock button 121 from the slide latch 122 and allows up and down movement of the lock button.

The slide latch 122 comprises a hole 124 formed approximately in a middle position thereof for receiving the press part 313 of the latch button 121. The slide latch 122 further comprises a projecting tongue 122a formed at a side in its lengthwise direction, which matches with a lateral slot 133a formed at a side of the first mounting base 133, so that at least a part of said projecting tongue stays in the lateral slot no matter the slide latch 122 slides to the left or to the right.

The spring member 125 comprises a flat part 351, a spring reaction part 352, a contact part 353 and a protrusion part 354. The flat part 351 is located at one end of the spring member 125 and fixed to the bottom of the slide latch 122 by fixing units which pass through the first sliding slot 134a and the third sliding slot 134c (see FIG. 2). The spring reaction part 352 is located between the flat part 351 and the contact part 353. The spring reaction part 352 may include a downward recess part or any other structure that can produce a spring deformation. The contact part 353 contacts the bottom of the support part 312 of the lock button 121 that passes through the second sliding slot 134b (see FIG. 2). In a case where the lock button 121 is not pressed, the contact part provides a certain upward preset spring force to the lock button 121 so that the lock button will not drop down. The protrusion part 354 is formed at one end of the contact part 353, as shown by the FIGURE, the spring reaction part 352 is connected to the other end of the contact part 353. The protrusion part 354 comprises a left side 354a and a right side 354b.

Still referring to FIG. 3A, it shows the situation where the slide latch 122 is locked and cannot move to the left or right. As shown in the FIGURE, when the slide latch 122 is locked, the lock button is not pressed down, the spring member 125 receives no force for moving downward from the support part 312, and the protrusion part 354 on the spring member is in its first position. At the first position of the protrusion part 354, the protrusion part 354 is located in the second sliding slot 134b so that right side 354b of the protrusion part is blocked by the right wall of the second sliding slot 134b, resulting in that the slide latch 122 cannot move to the right. At this position, the slide latch also cannot move to the left since its left side is limited by the left wall of the first mounting base 133.

Furthermore, the block 134d formed on the partition board 134 may also interact with the spring member 125. A gap 353a may be formed in the contact part 353 of the spring member 125. In a case where the lock button 121 is not pressed and no spring deformation of the spring reaction part 352 occurs, the gap is blocked by the block 134d, thereby further preventing the slide latch 122 from moving to the right.

Figure 3B:
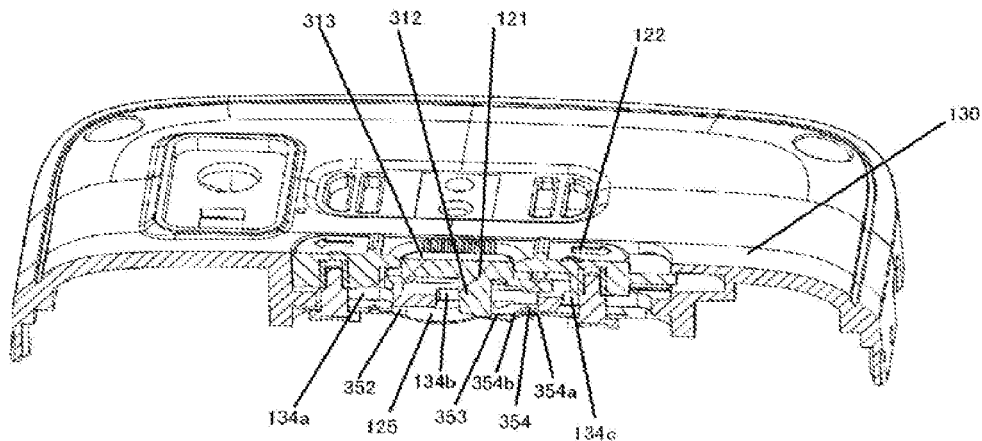

Next, referring to FIG. 3B, an operator presses the press part 313 on the lock button 121 so that the lock button moves downward. The support part 312 of the lock button presses the contact part 353 of the spring member so that the spring reaction part 352 produces a downward spring deformation. The spring deformation brings the contact part 353 and the protrusion part 354 to move downward so that the protrusion part 354 leaves away from the blocking range of the right wall of the second sliding slot 134b, meanwhile the gap 353a of the contact part 353 leaves away from the blocking range of the block 134d. Then, the right wall 354b of the protrusion part is no longer blocked by the block 134d, thus the sliding latch may slide to the right.

Figure 3C:
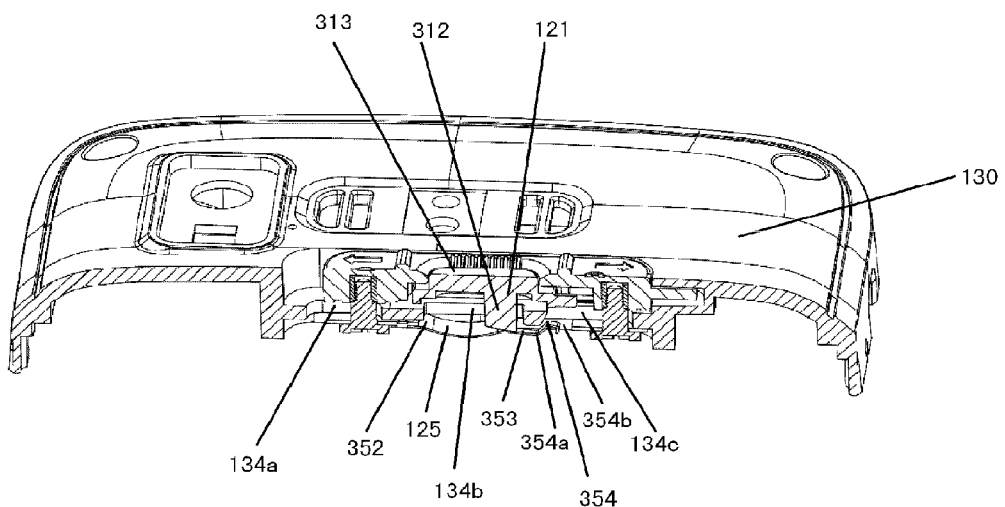

Now referring to FIG. 3C, when the lock button 121 is pressed down, the slide latch 122 and the spring member 125 are pushed a distance toward the right which is sufficient to make the protrusion part 354 on the spring member 125 go beyond the distance between the right wall of the second sliding slot 134b and the left wall of the third sliding slot 134c.

Figure 3D:
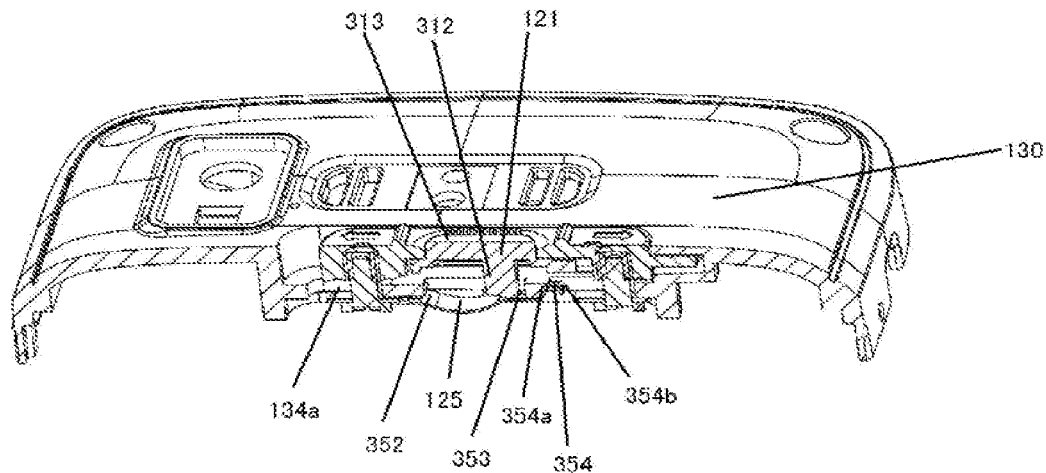

Then referring to FIG. 3D, as shown by FIG. 3C, the slide latch 122 moves a distance to the right to make the protrusion part 354 go beyond the distance between the right wall of the second sliding slot 134b and the left wall of the third sliding slot 134c. Then, the lock button 121 is released to make the spring deformation of the spring member 125 recovered, the contact part and the protrusion part 354 moves upward, thus the protrusion part 354 enters the third sliding slot 134C, at this time the left side 354a of the protrusion part 354 is blocked by the left wall of the third sliding slot 134c, resulting in that the spring member 125 and the slide latch 122 cannot move to the left, meanwhile, the slide latch 122 also cannot move to the right since its right side is limited by the right wall of the first mounting base 133.

FIGS. 3A-3D describe in detail the process of controlling the sliding latch 122 to slide from left to right by the lock button 121. As to the process of the sliding latch 122 sliding from right to left, it may be easily derived by those skilled in the art according to the foregoing descriptions, no more unnecessary details will be provided here.

Figure 4:
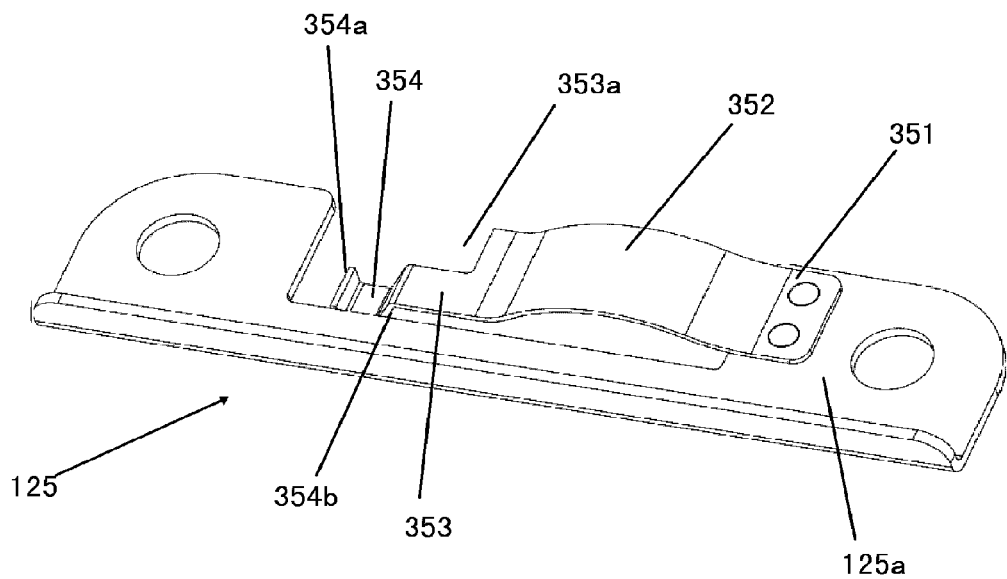
FIG. 4 is a structural diagram of the spring member according to the embodiment of the present invention.

FIG. 4 is a structural diagram of the spring member 125 according to the embodiment of the present invention. As shown by FIG. 4, the spring member 125 may be made of spring sheets such as metal sheet and may comprise a flat part 351, a spring reaction part 352, a contact part 353 and a protrusion part 354. The spring member may further comprise a mounting base 125a, a through hole is formed on the mounting base 125a, the mounting base 125a is mounted on the slide latch 122 by using a screw (126 in FIG. 2) and a nut (127 in FIG. 2) (see FIGS. 3A-D). As shown by FIG. 4, a gap 353a is formed in the contact part 353 of the spring member, the gap 353a interact with the block 134d (see FIG. 2) formed on the partition board 134. For example, when the slide latch 122 is in the first position as shown by FIG. 3 and the lock button 121 is not pressed down, the block 134d blocks the edge of the gap 353a from crossing over the block 134d. When the lock button 121 is pressed down, the spring member is subject to a spring deformation, bringing the edge of the gap 353a moving out of the blocking area of the block 134d.

The mechanism where the slide latch 122 in the locking mechanism 120 slides to the left and right between the first position and the second position is descried in the foregoing paragraphs. How to enable the back housing body 130 to snap or to unsnap with the battery cover 110 by the moving of slide latch 122 to the left and right will be described in detail below.

Figure 5:
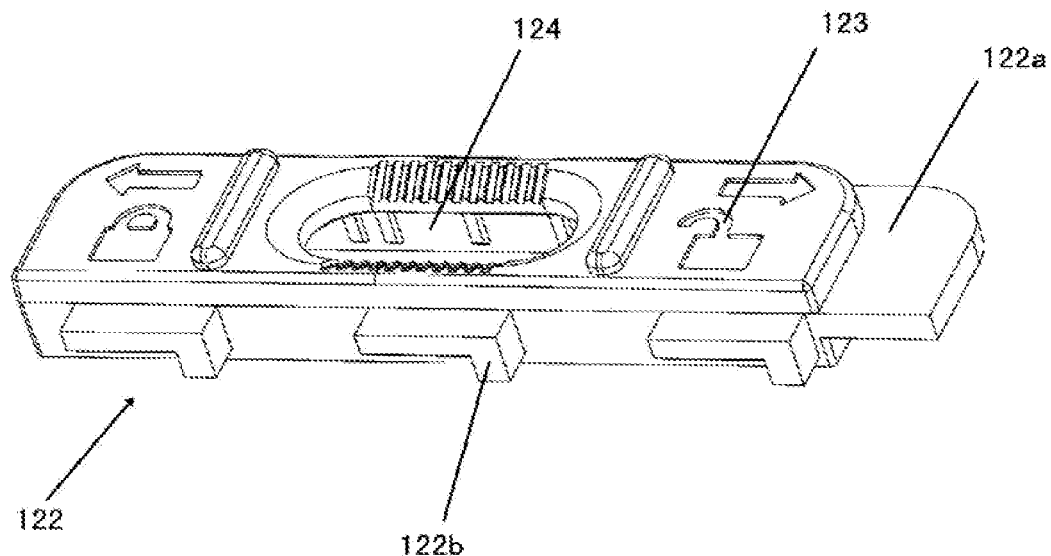
FIG. 5 is a perspective view of the slide latch according to the embodiment of the present invention.

FIG. 5 is a perspective view of the slide latch 122 according to the embodiment of the present invention. As shown by FIG. 5, the slide latch 122 comprises: a hole 124 for receiving the lock button 121, an indicator 123 for indicating a sliding direction and a locking state of the slide latch 122, a projecting tongue 122a formed at a side in the lengthwise direction of the slide latch 122, and a snap 122b formed at the front side of the slide latch. As shown by the FIGURE, the snap comprises a lateral extension part and vertical extension part to form a bending structure. The snap 122b slides to the left and right along with the slide latch thereby to be snapped or unsnapped with another snap on the battery cover 110.

Figure 6:
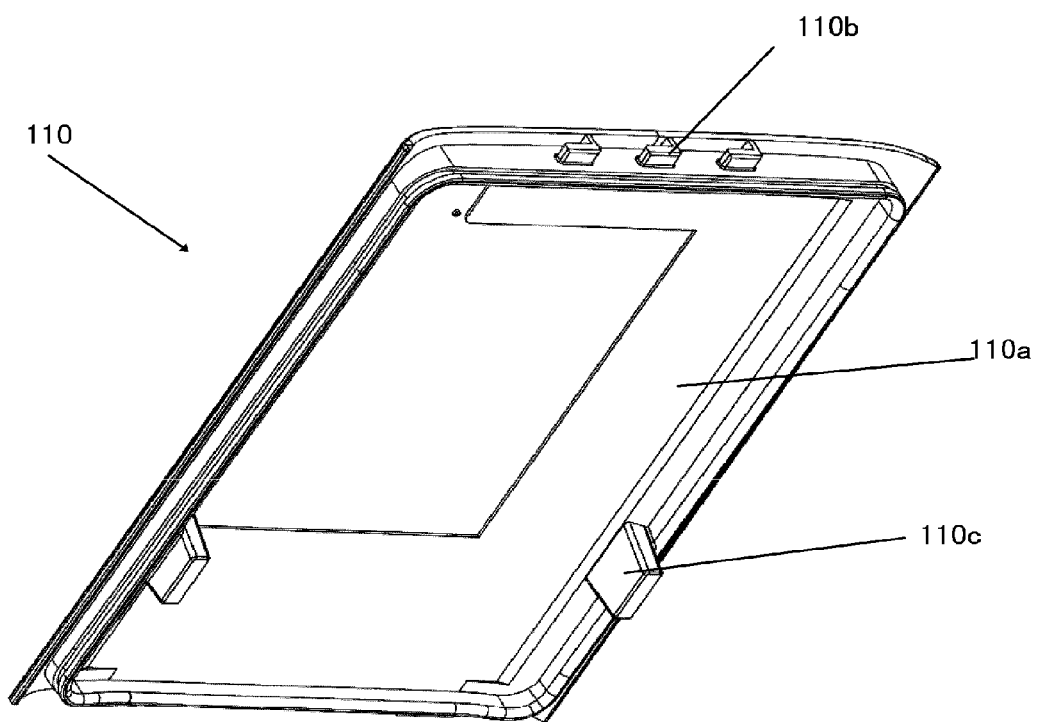
FIG. 6 is a perspective view of the battery cover according to the embodiment of the present invention.

FIG. 6 is a perspective view of the battery cover 110 according to the embodiment of the present invention. As shown by FIG. 6, the battery cover 110 comprises a battery cover body 110a, a second snap 110b on the top of the battery cover 110 and positioning components 110c on both sides of the battery cover body 110a. Optionally, the battery cover 110 may further comprise a battery assembly integral with the battery cover body 110a. Positioning components 110c are used to cooperate with the corresponding components in the back housing body 130 to prevent the battery cover 110 from shifting to the left and right during usage. The second snap 110b is also a bending structure that comprises a lateral extension part and a vertical extension part. The second snap 110b is used to snap with the snap 122b on the slide latch 122 so that the back housing body 130 and the battery cover 110 are snapped together.

Figure 7A:
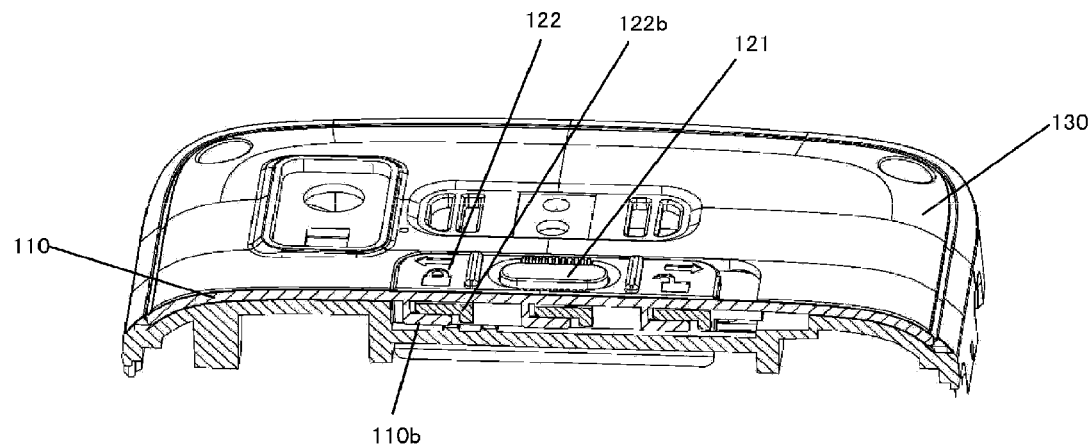
FIGS. 7A-B are section views illustrating the back housing body of the Industry Mobile Terminal snapping with or unsnapping from the battery cover according to the embodiment of the present invention.
Figure 7B:
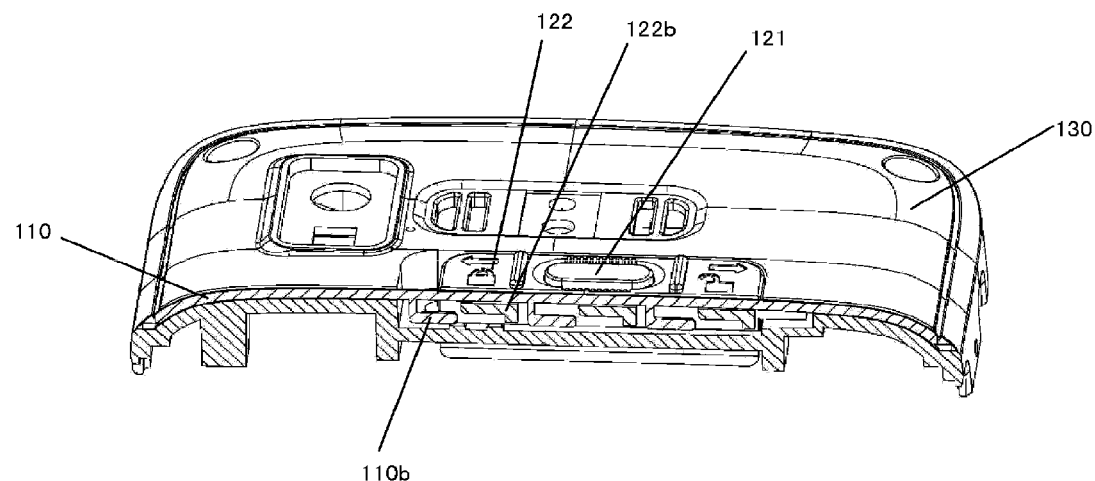

FIGS. 7A-B are section views illustrating the back housing body of the Industry Mobile Terminal snapping with or unsnapping from the battery cover according to the embodiment of the present invention, wherein the section views are obtained by sectioning along the line B-B as shown by FIG. 1.

Referring to FIG. 7A, wherein the slide latch 122 is located at the left side, first position, the snap 122b on the slide latch 122 is snapped with the second snap 110b on the battery cover 110 so that the back housing body 130 of the Industry Mobile Terminal is snapped with the battery cover 110.

Referring to FIG. 7B, wherein the slide latch 122 is located at the right side, second position, the snap 122b on the slide latch 122 is unsnapped from the second snap 110b on the battery cover 110 so that the battery cover 110 and the corresponding battery assembly may be detached from the mobile terminal by one hand only.

Specific examples of the present invention are provided below:

Example 1. A locking mechanism in a mobile terminal, comprising a lock button, a slide latch, and an spring member,
   the slide latch may slide between a first position and a second position, and the slide latch comprises a hole and snaps, the hole is on the top of the slide latch and extends through the slide latch, and the snaps are at the front side of the slide latch;
   the lock button is in the hole and comprises a press part and a support part, the support part being connected to the press part and extending downward from the press part through the hole to be in contact with the contact part on the spring member;
   the spring member is fixed with the slide latch and comprises an spring reaction part, a contact part and a protrusion part, the contact part being in contact with the support part of the lock button and a force from the support part causing a spring deformation in the spring reaction part;
   when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part (354) moving to an unblocked position;
   in a case where the protrusion part is not blocked, the slide latch may slide between the first position and the second position for snapping or unsnapping by the snap.

Example 2. The locking mechanism according to example 1, wherein the press button further comprises a fixing part for preventing detachment of the lock button from the hole.

Example 3. The locking mechanism according to example 1, wherein the spring member is made of elastic spring sheet, and the spring member further comprises a flat part, and the flat part, the spring reaction part, the contact part and the protrusion part are connected in turn.

Example 4. The locking mechanism according to example 1, wherein a partition board is provided between the spring member and the slide latch, when no external force is applied to the press part of the lock button, the protrusion part is blocked by the first side of the first component on the partition board.

Example 5. The locking mechanism according to example 4, wherein when the external force is applied to the press part of the lock button (121), the spring deformation causes the contact part to move downward, thereby bringing the protrusion part (354) moving downward, so that the first side of the protrusion part (354) leaves away from the blocking range of the first side of the first component.

Example 6. The locking mechanism according to example 4, wherein when the first side of the protrusion part leaves away from the blocking range of the first side of the first component, the slide latch is able to slide a distance, then the external force is removed so that the spring deformation of the spring reaction part is recovered, thus the contact part brings the protrusion part to move upward to another position where the second side of the protrusion part is blocked by the second side of the first component.

Example 7. The locking mechanism according to example 4, wherein the partition board further comprises a second component, a gap is further formed in the contact part of the spring member, when the external force is not applied to the press part of the lock button, the edge of the gap is blocked by the second component.

Example 8. The locking mechanism according to example 4, sliding slots are formed on the partition board, the sliding latch and the spring member are fixed together through the sliding slots, and the sliding latch and the spring member can move relative to the sliding slots, the first component on the partition board is a spacer between the two neighboring sliding slots.

Example 9. A mobile terminal comprising a back housing, wherein the back housing comprising a back housing body and a battery cover,
  the locking mechanism according to any one of examples 1-8 is located in one of the back housing body and the battery cover; and
  a second snap is formed on the other one of the back housing and the battery cover, for snapping with the snap on the slide latch in the locking mechanism to fix the back housing body and the battery cover together.

Example 10. A method of manufacturing a locking mechanism in a mobile terminal, the locking mechanism comprising a lock button, a slide latch, and spring member, the method comprising:
  providing the slide latch, the slide latch may slide between a first position and a second position and comprise a hole and snaps, the hole is on the top of the slide latch and extends through the slide latch, and the snaps are at the front side of the slide latch;
  providing the lock button in the hole, the lock button comprising a press part and a support part, the support part being connected to the press part and extending downward from the press part through the hole to be in contact with the contact part on the spring member;
  providing the spring member and enabling the spring member to be fixed with the slide latch, the spring member comprising an spring reaction part, a contact part and a protrusion part, the contact part being in contact with the support part of the lock button and a force from the support part causing a spring deformation in the spring reaction part;
  when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part moving to an unblocked position;
  in a case where the protrusion part is not blocked, the slide latch may slide between the first position and the second position for snapping or unsnapping by the snap.

Figure 8:
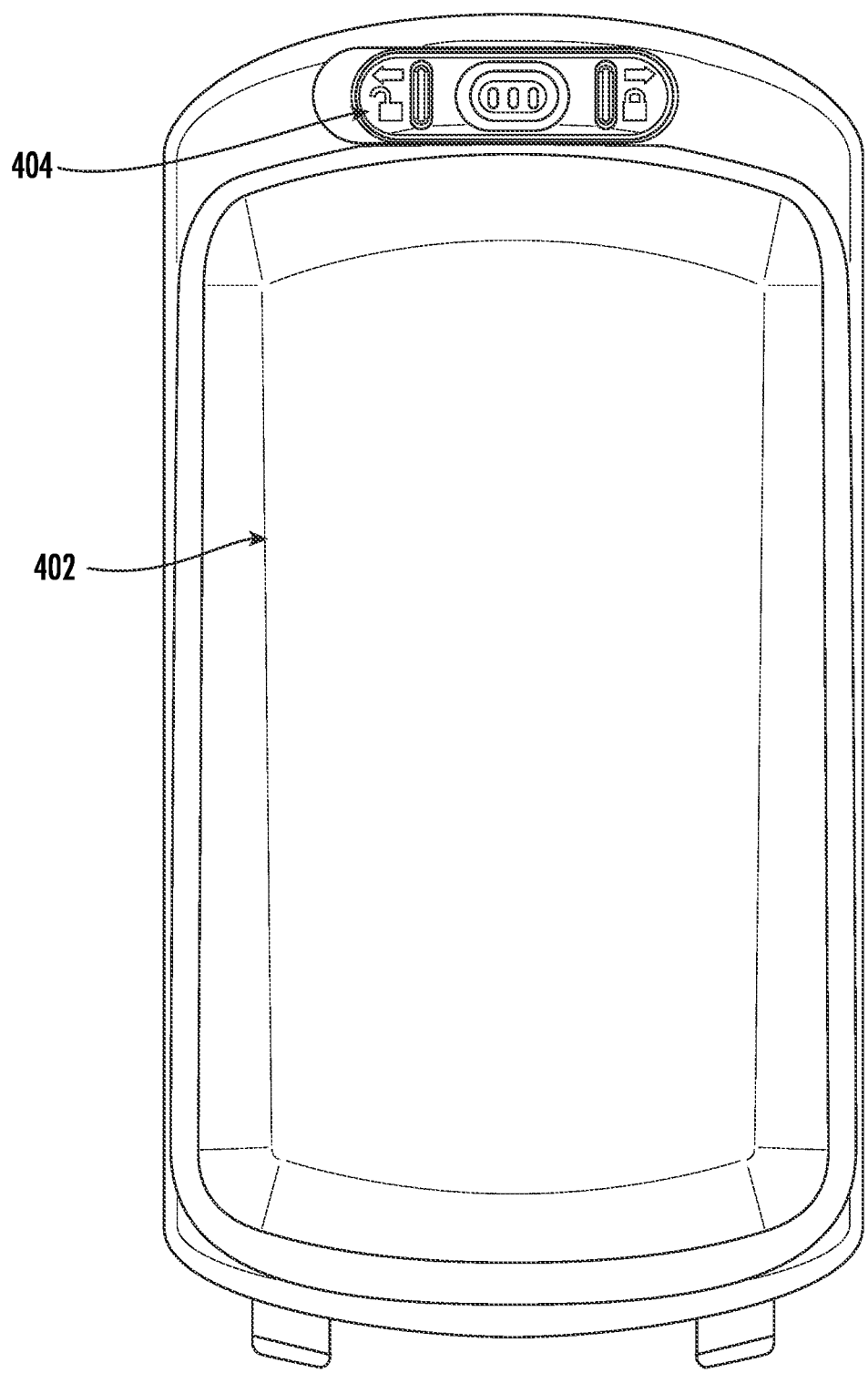
FIG. 8 illustrates a front view of a battery cover and locking mechanism according to an alternative embodiment of the present invention.
Figure 9:
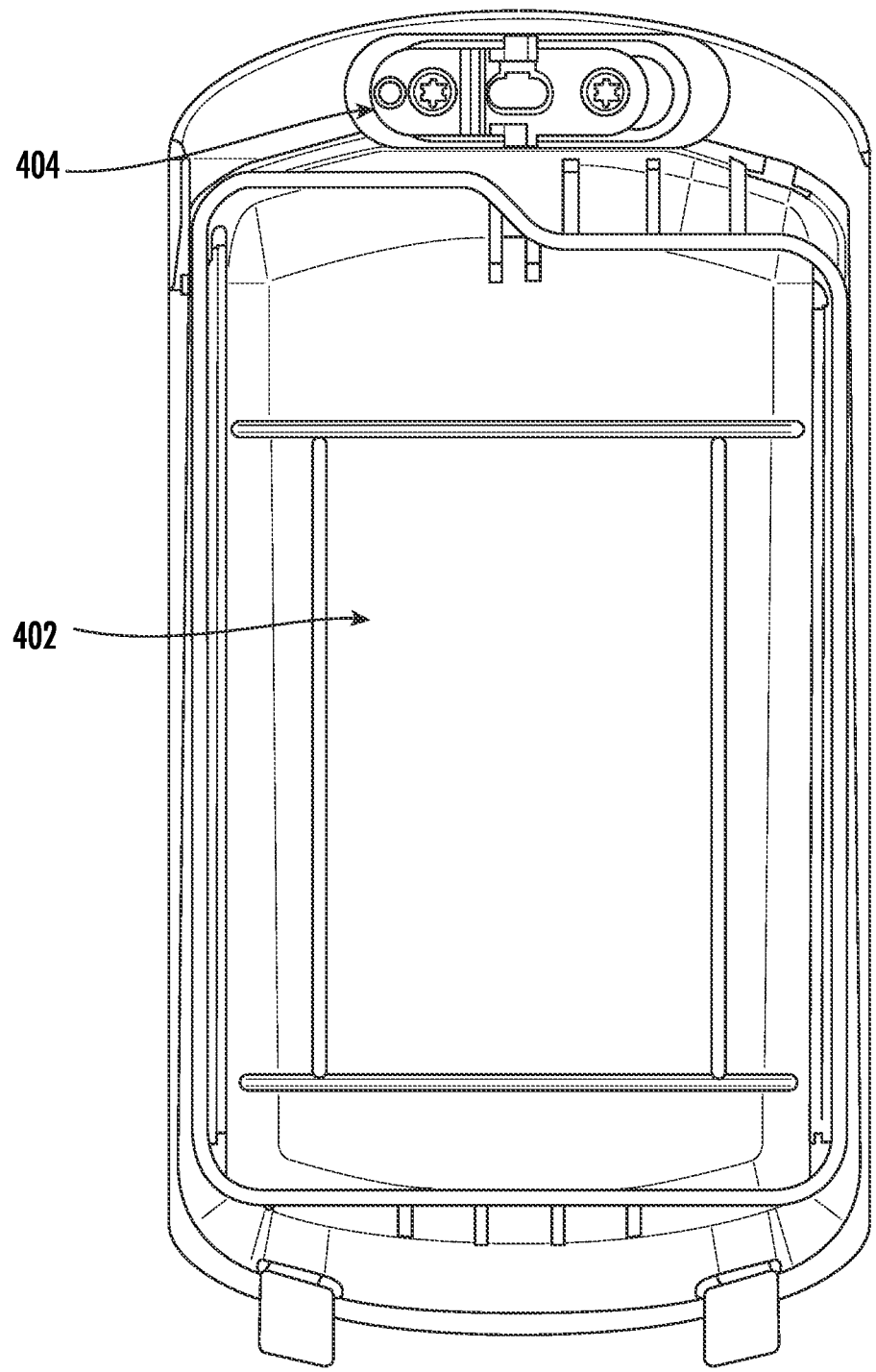
FIG. 9 illustrates a back view of the battery cover and locking mechanism of FIG. 8 according to an alternative embodiment of the present invention.

An alternative embodiment of an Industry Mobile Terminal is illustrated in FIGS. 8-13B. With reference to FIGS. 8-9, a battery cover 402 is illustrated with a locking mechanism 404 configured to be received by a backing housing (e.g., backing housing 400 in FIGS. 11A-13B) of an Industry Mobile Terminal. While described hereinafter with reference to an Industry Mobile Terminal, the present disclosure contemplates that the locking mechanisms and associated coverings described herein may equally be applied to any electronic or computing device (e.g., mobile phone, laptop computer, or the like) that includes a battery replaceable by a user.

Figure 10:
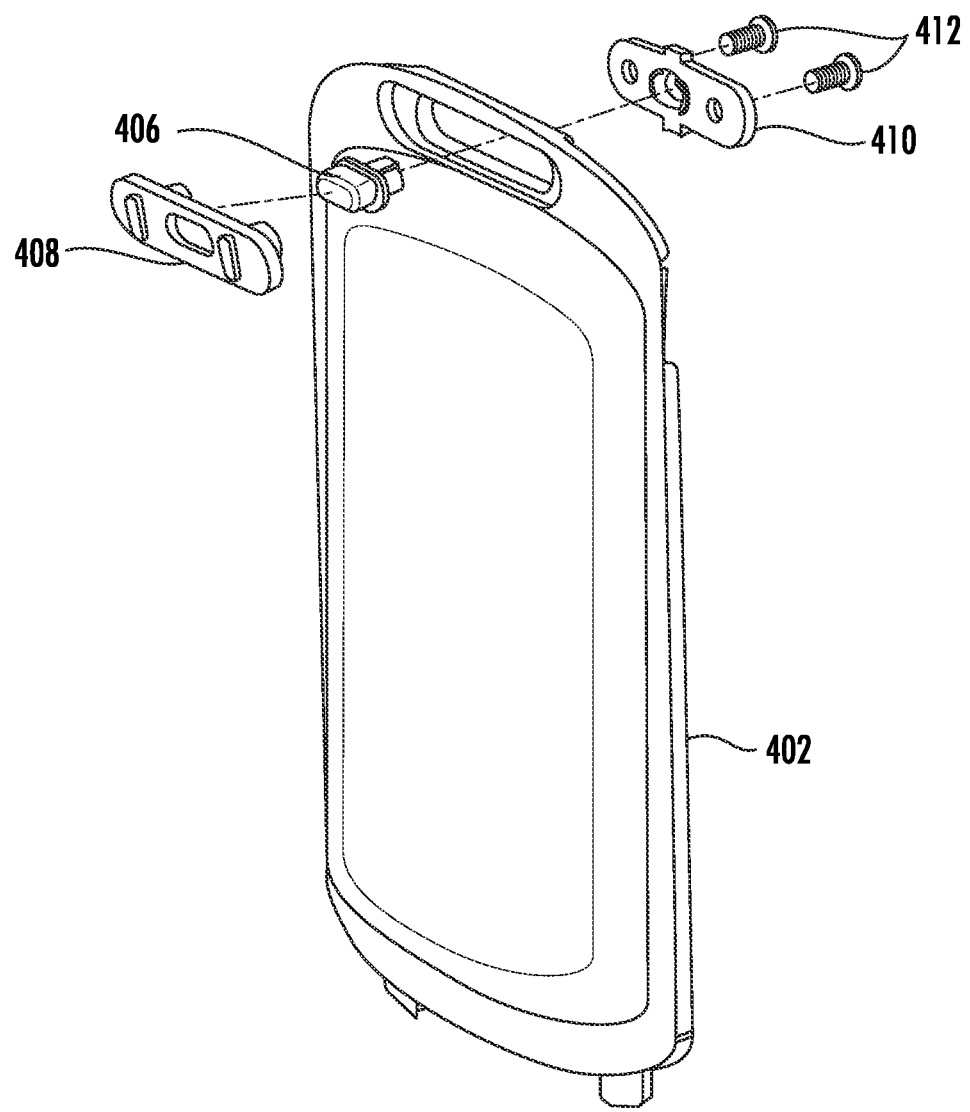
FIG. 10 illustrates an exploded view of the battery cover and locking mechanism of FIGS. 8-9 according to an alternative embodiment of the present invention.

As shown in FIGS. 8-10, the battery cover 402 may be configured to enclose or otherwise secure a battery to a backing housing. In order to ensure the battery cover 402 remains attached to a backing housing, the battery cover 402 may be hinged proximate a first end of the battery cover 402, and may utilize a locking mechanism 404 proximate a second end of the battery cover, opposite the first end of the battery cover, which may allow a user access (e.g., via unlocking the locking mechanism 404) to the contents enclosed by the battery cover 402. As shown in the exploded view of FIG. 10, the locking mechanism 404 may include a button 406, a slider 408, a latch 410, and attachment elements 412.

Figure 11A:
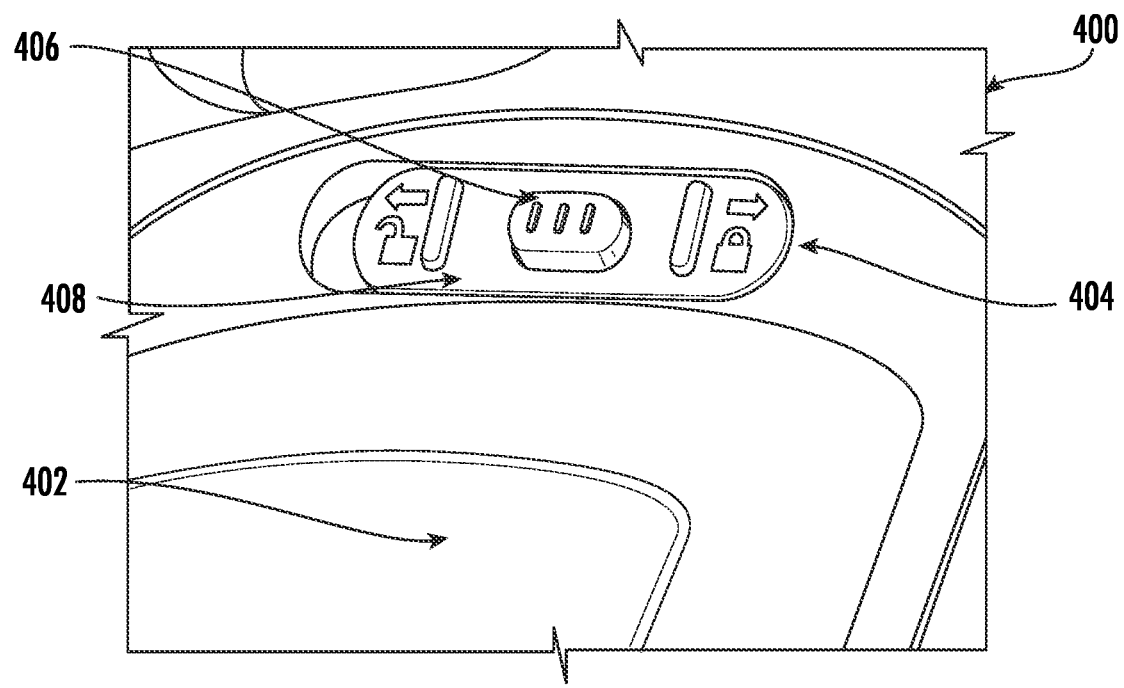
FIG. 11A illustrates the battery cover and locking mechanism of FIGS. 8-10 in a locked position according to an alternative embodiment of the present invention.
Figure 11B:
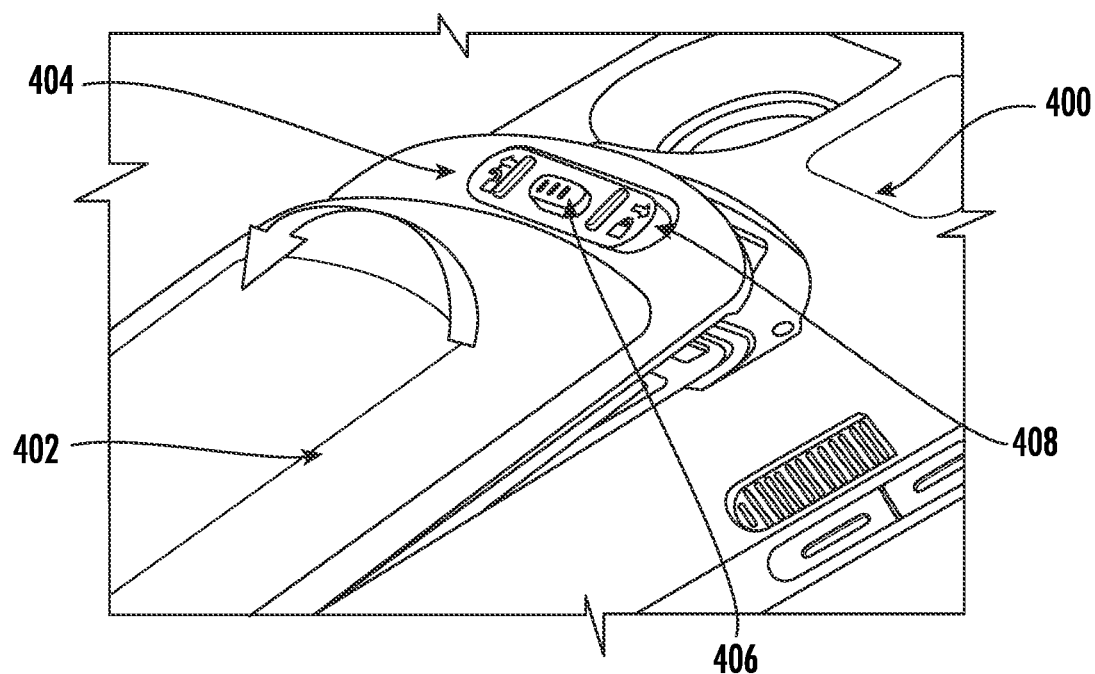
FIG. 11B illustrates the battery cover and locking mechanism of FIGS. 8-10 in an unlocked position according to an alternative embodiment of the present invention.

With reference to FIGS. 11A-11B, operation of the locking mechanism 404 between a locked and an unlocked position is shown, respectively. As shown in FIG. 11A, the battery cover 402 is attached to the backing housing 400 in a locked position in which the slider 408 of the locking mechanism 404 is located in a rightward position. Similarly, the battery cover 402 is detached from the backing housing 400 in FIG. 11B and in an unlocked position in which the slider 408 is located in a leftward position relative the locked position. While in an unlocked position in which the slider 408 is in a leftward position relative the locked position, the battery cover 402 is detachable from the backing housing 400 as shown in order to provide access to the contents housed therein. While the above description references a rightward position and a leftward position of the slider 408 as corresponding to locked and unlocked positions, respectively, the present disclosure contemplates that the locking mechanism 404 may be configured such that translation of the slider 408 between any two positions transitions the locking mechanism between locked and unlocked positions.

Figure 12:
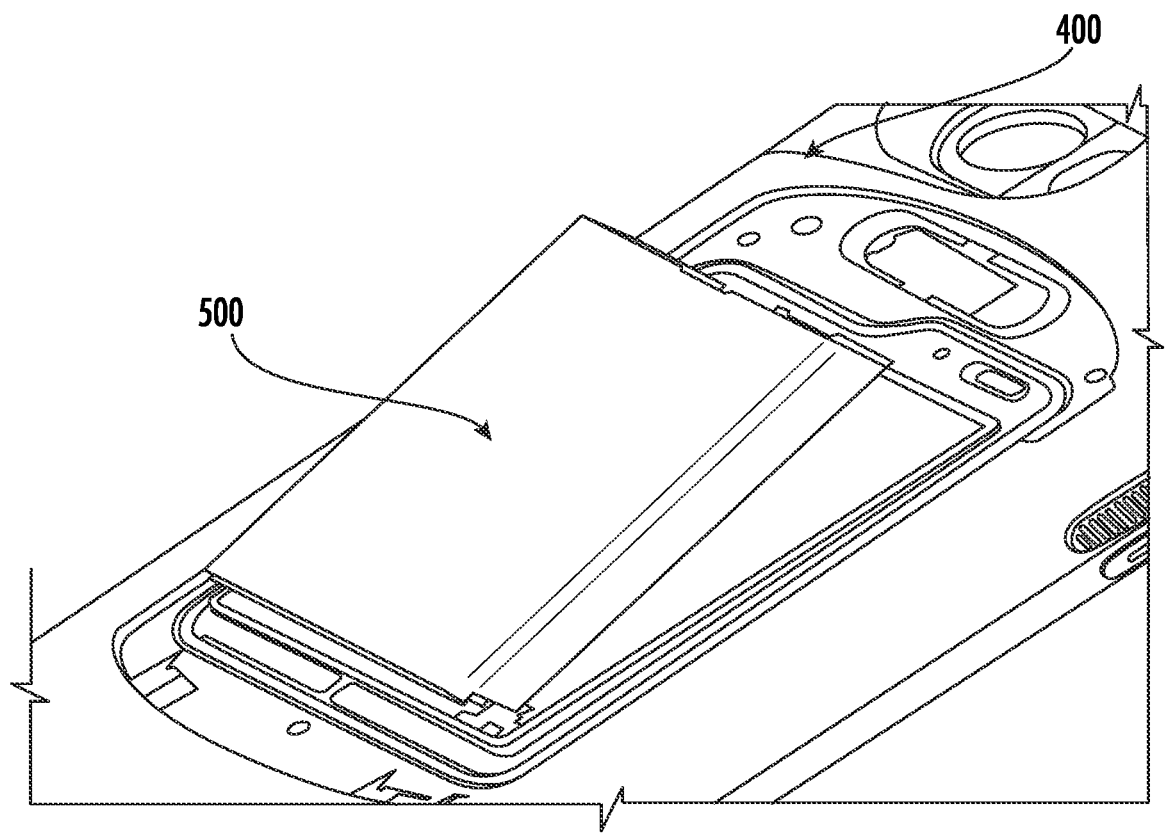
FIG. 12 illustrates an Industry Mobile Terminal's back housing with the battery cover and locking mechanism of FIGS. 8-10 removed to show the battery according to an alternative embodiment of the present invention.

As would be understood by the description provided hereafter, a user may transition between the locked position of FIG. 11A to the unlocked position of FIG. 11B by applying a force to the button 406 (e.g., substantially perpendicular with respect to the slider 408) such that the button 406 is compressed and translates at least partially into the backing housing 400. A user may they apply a translational force to the slider 408 such that the slider 408 moves between the rightward and leftward positons (e.g., locked and unlocked positions) to detach the battery cover 402 from the backing housing 400. As shown in FIG. 12, once the battery cover 402 is removed from the backing housing 400, access to the battery 500 enclosed by the backing housing 400 and the battery cover 402 may be provided.

Figure 13A:
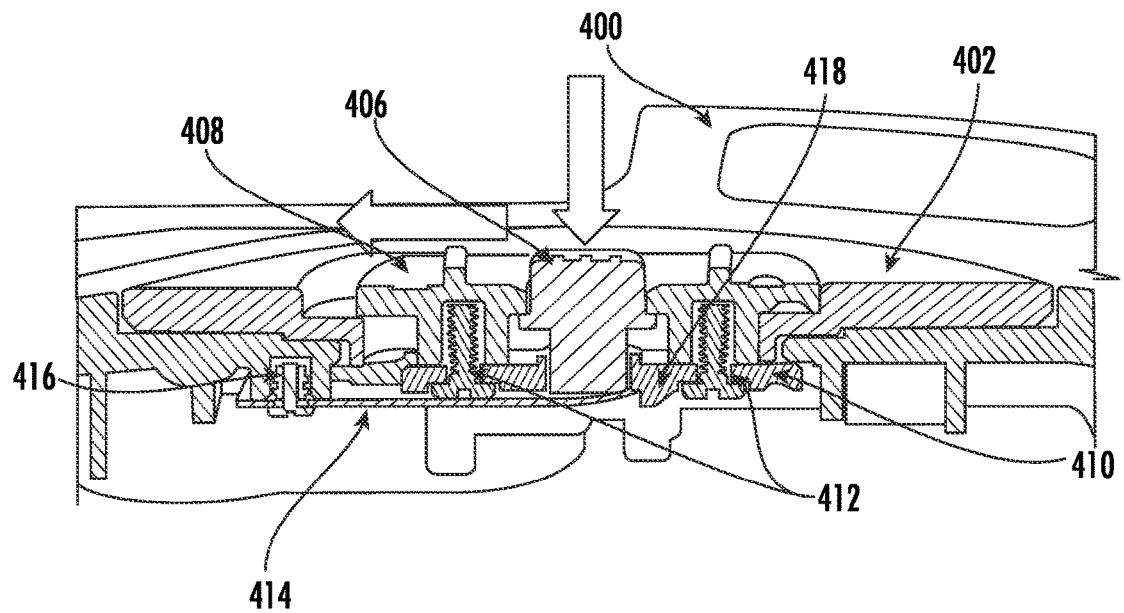
FIG. 13A illustrates a cross-section view of the locking mechanism of FIGS. 8-10 in a locked position according to an alternative embodiment of the present invention.
Figure 13B:
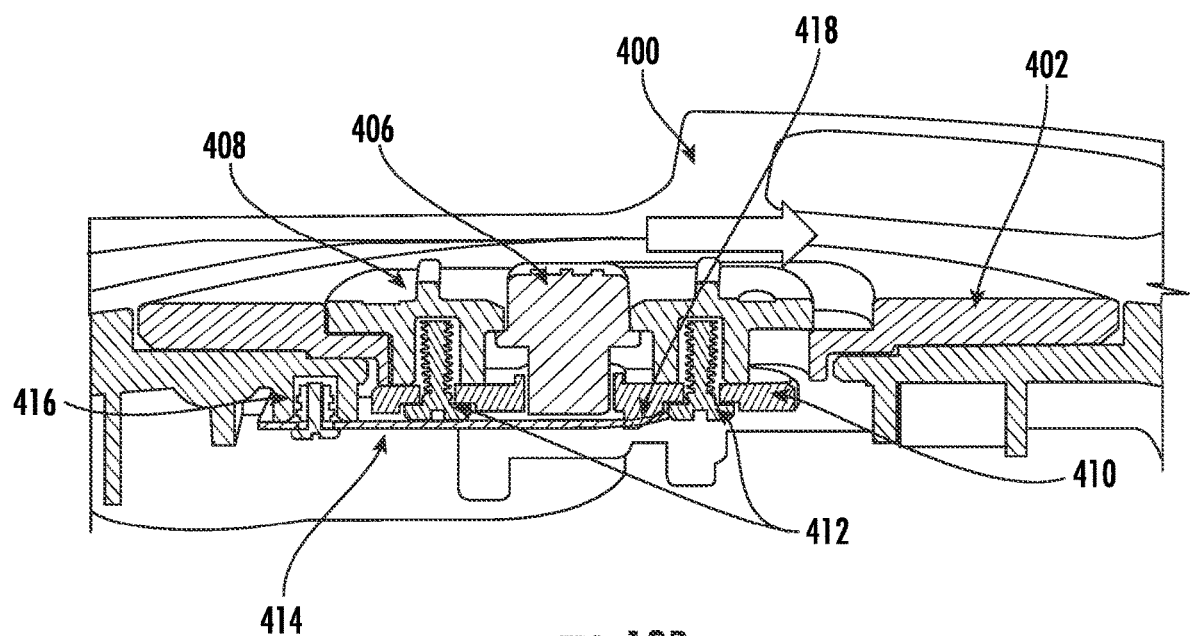
FIG. 13B illustrates a cross-section view of the locking mechanism of FIGS. 8-10 in an unlocked position according to an alternative embodiment of the present invention.

With reference to FIGS. 13A-13B, a cross-sectional view of the locking mechanism 404 is provided in a locked and an unlocked position, respectively. As shown, the locking mechanism 404 may include the slider 408 attached to the latch 410 via two (2) attachment elements 412. While illustrated with two (2) screws as attachment elements 412, the present disclosure contemplates that the slider 408 and latch 410 may be attached to one another via any attachment means known in the art (e.g., male to female connections, adhesives, latches, or the like). As shown, the slider 408 may be configured such that a least a portion of the slider 408 is exposed to the exterior of the battery cover 402. As shown in FIGS. 11A-11B, this portion of the slider 408 may include images or other descriptors to indicate to a user an appropriate operation of the locking mechanism 404. By way of example, the exterior portion of the slider 408 may include various arrows to indicate the proper direction in which to translate the slider 408 in order to achieve the desired results (e.g., locking or unlocking the locking mechanism 404).

With continued reference to FIGS. 13A-13B, the attachment between the slider 408 and the latch 410 may be such that an opening is created for receiving the button 406. Said differently, the slider 408 and the latch 410 may each define concentric openings such that the button 406 (e.g., when subjected to a force by the user) may translate at least partially into the backing housing 400 without obstruction by the slider 408 or the latch 410. The button 406, as shown, may be configured (e.g., sized and/or dimensioned) to be received by the opening of the slider 408 and the latch 410 such that the button 406 may only translate into the housing body 400. By way of example, the button 406 may be dimensioned as a substantially cylindrical element received within the circular openings of the slider 408 and the latch 410 with portions of the cylindrical element having different diameters. As shown, at least a portion of the button 406 may have a diameter which is larger than the diameters of the openings of the slider 408 and the latch 410 such that the button 406 may only translate between two locations. As would be evident in light of the above description, the button 406 may be dimensioned so as to translate between any two locations depending upon the desired application and the required force of the locking mechanism 404.

The latch 410 of the locking mechanism 404 is attached to the slider 408 via the attachment elements 412 and configured, along with the slider 408, to limit movement of the battery cover 402 when in a locked position (e.g., FIG. 13A). The latch 410 and the slider 408 may each extend outward of the button 406 to provide a lip, flange, extension, or the like along an exterior edge of the latch 410 and slider 408. As shown, the exterior edge of the latch 410 and the slider 408, in a locked position, contact an exterior surface of the battery cover 402 and an interior surface of the backing housing 400. Said differently, when the slider 408 and attached latch 410 translate to a locked position, the latch 410 and the slider 408 limit the movement of the battery cover 402 with respect to the backing housing 400 and ensure contact between these elements. A portion of the housing 422 is engaged by a portion of the latch 410, thereby securing the housing 400 to the battery cover 402 and precluding relative movement apart.

The latch 410 may also define a protrusion 418 (e.g., tab, ramp, or the like) which extends perpendicularly inward with respect to the backing housing 400. As described hereinafter with reference to a spring 414, the protrusion 418 and the spring 414 may operate to secure the locking mechanism 404 in a locked position until a user applies a sufficient force to the button 406.

As shown in FIGS. 13A-13B, the backing housing 400 may include a spring 414 attached to the backing housing 400 at a single end via a pin 416. The spring 414, in some embodiments, may be affixed to the backing housing 400 at a single end (e.g., via the pin 416) and may extend from the pin 416 to terminate beneath the button 406 and the latch 410. As shown, in some embodiments, the spring 414 directly contacts the button 406 and the protrusion 418 of the latch 410. In such a configuration, in a locked position, the spring 414 may provide an upward force (e.g., perpendicularly outward with respect to the backing housing 400) to the button 406 and may contact a vertical edge of the protrusion 418 such that the latch 410 may not translate from a rightward position (e.g., locked) to a leftward position (e.g., unlocked).

In an instance in which an external force from a user is applied to the button 406, the contact between the button 406 and the spring 414 may be such that the spring 414 bends (e.g., deforms) inwardly so as to allow translation of the latch 410. Said differently, a user may press the button 406 such that the button 406 translates at least partially into the backing housing 400 and, via contact with the spring 414, transfers the force from the user to the spring 414. This force results in deformation of the spring 414 (e.g., about the pin 416), thereby allowing the protrusion 418 to freely translate. To be clear, the spring's 414 constant contact with the button 406 and the protrusion 418 blocks movement of the latch 410 and slider 408 until a sufficient user force is applied to the button 406 to deform the spring 414 and unblock the protrusion 418.

As shown in FIG. 13B in which the locking mechanism 404 is in an unlocked position, the force of the spring on the button 406 and the latch 410 may be such that the battery cover 402 is at least partially detached from the housing backing 400. In the unlocked position of FIG. 13B, the latch 410 is disengaged from the portion 422 of the housing 400 that secures the battery cover 402 to the housing 400 in the locked position of FIG. 13A. To transition between the unlocked position of FIG. 13B to the locked position of FIG. 13A, a user may input a translational force to the slider 408, and via connection between the slider 408 the latch 410, in the rightward direction. As would be evident to one of ordinary skill in the art in light of the description above, due to contact between the spring 414 and the latch 410, the translation of the slider 408 may function to snap the battery cover 402 into a locked position. To be clear, adjacent the vertical edge of the protrusion 410 is a ramped portion configured to allow translation of the latch 410 from left to right until the protrusion reaches the locked position in which the vertical edge of the protrusion 418 is located rightward of the unfixed edge (e.g., opposite the pin 416) of the spring 414. As shown, the spring 414, when transitioning to a locked position, may reach the point between the ramped portion and the vertical edge of the protrusion 418 such that, in the absence of a user force deforming the spring 414, the spring may return to its locked position in contact with the button 406 and the vertical edge of the protrusion 418.

Although the present invention is described with limited embodiments, on account of the above descriptions, it may be appreciated by those skilled in the art that other embodiments may be conceived within the scope of the present invention described herein. It may be acknowledged that for sake of clearness some features of the present invention described in the context in a single embodiment may be further provided in a combined manner in a single embodiment. In contrast, for sake of simplicity the features of the present invention described in the context in a single embodiment may be appropriately further provided separately, in any suitable sub-combination, or in any other embodiment of the present invention. No certain features described in the context in the embodiments shall be regarded as the essential features for the embodiments, except that said embodiments are invalid if without those elements.

What is claimed is:

1. A locking mechanism in a mobile terminal, comprising:
 a slider disposed on an exterior side of a battery cover of the mobile terminal and comprising an opening extending through the slider and configured to translate between a locked position and an unlocked position;
 a latch disposed on an interior side of the battery cover of the mobile terminal and attached to the slider, wherein the latch is configured to translate between the locked position and the unlocked position, and wherein the latch comprises a corresponding opening extending through the latch and a protrusion;

a button disposed within the opening of the slider and the corresponding opening of the latch; and a spring in contact with the button and the latch, wherein in an instance in which an external force is applied to the button, the external force deforms the spring such that contact between a vertical edge of the protrusion and the spring is precluded allowing translation of the slider and the latch between the locked position and the unlocked position, wherein the latch and the slider each extends outward of the button to provide at least one of a lip, a flange, or an extension along an exterior edge of the latch and the slider that contact an exterior surface of the battery cover and an interior surface of a back housing of the mobile terminal.

2. The locking mechanism according to claim 1, wherein the protrusion further comprises a ramped portion proximate the vertical edge of the protrusion.

3. The locking mechanism according to claim 2, wherein in an instance in which an external translational force is applied to the slider, the ramped portion of the protrusion contacts the spring so as to allow translation of the slider and the latch between the unlocked position and the locked position.

4. The locking mechanism according to claim 3, wherein a point between the ramped portion and the vertical edge of the protrusion is configured such that, absent the external force applied to the button deforming the spring, the point transitions the locking mechanism between the unlocked position and the locked position.

5. The locking mechanism according to claim 1, wherein the latch, in the locked position, engages with at least a portion of the back housing of the mobile terminal.

6. The locking mechanism according to claim 1, wherein the back housing of the mobile terminal comprises a mounting part, wherein the mounting part further comprises a first mounting base and a second mounting base that are separated by a partition board.

7. The locking mechanism according to claim 6, wherein at least one sliding slot is formed on the partition board.

8. The locking mechanism according to claim 1, wherein the button comprises a press part, a support part and a fixing part, where the support part is connected to the press part and extends downward from the press part through a sliding slot in a partition board.

9. The locking mechanism according to claim 8, wherein the support part extends downward to be in contact with a contact part of the spring located in a second mounting base.

10. The locking mechanism according to claim 1, wherein the latch further comprises a projecting tongue formed at a side in its lengthwise direction, wherein the projecting tongue matches with a lateral slot formed at a side of a first mounting base.

11. A method of manufacturing a locking mechanism in a mobile terminal, the method comprising:

disposing a slider on an exterior side of a battery cover of the mobile terminal, wherein the slider comprises an opening extending through the slider and is configured to translate between a locked position and an unlocked position;

disposing a latch on an interior side of the battery cover of the mobile terminal, wherein the latch is attached to the slider and configured to translate between the locked position and the unlocked position, wherein the latch comprises a corresponding opening extending through the latch and a protrusion;

disposing a button within the opening of the slider and the corresponding opening of the latch; and providing a spring in contact with the latch and the button, wherein in an instance in which an external force is applied to the button, the external force deforms the spring such that contact between a vertical edge of the protrusion and the spring is precluded allowing translation of the slider and the latch between the locked position and the unlocked position, wherein the latch and the slider each extends outward of the button to provide at least one of a lip, a flange, or an extension along an exterior edge of the latch and the slider that contact an exterior surface of the battery cover and an interior surface of a back housing of the mobile terminal.

12. The method according to claim 11, wherein the latch, in the locked position, engages with at least a portion of the back housing of the mobile terminal.

13. The method according to claim 11, wherein, in an instance in which an external translational force is applied to the slider, a ramped portion of the protrusion contacts the spring so as to allow translation of the slider and the latch between the unlocked position and the locked position.

14. The method according to claim 13, wherein a point between the ramped portion and the vertical edge of the protrusion is configured such that, absent the external force applied to the button deforming the spring, the point transitions the locking mechanism between the unlocked position and the locked position.

15. The method according to claim 11, wherein the latch, in the locked position, engages with at least a portion of the back housing of the mobile terminal.

16. The method according to claim 11, wherein the back housing of the mobile terminal comprises a mounting part, wherein the mounting part further comprises a first mounting base and a second mounting base that are separated by a partition board.

17. The method according to claim 16, wherein at least one sliding slot is formed on the partition board.

18. The method according to claim 11, wherein the button comprises a press part, a support part and a fixing part, where the support part is connected to the press part and extends downward from the press part through a sliding slot in a partition board.

19. The method according to claim 18, wherein the support part extends downward to be in contact with a contact part of the spring located in a second mounting base.

20. The method according to claim 11, wherein the latch further comprises a projecting tongue formed at a side in its lengthwise direction, wherein the projecting tongue matches with a lateral slot formed at a side of a first mounting base.

* * * * *